(12) United States Patent  (10) Patent No.: US 7,747,911 B1
Rouse et al.  (45) Date of Patent: Jun. 29, 2010

(54) SELF VERIFICATION OF NON-VOLATILE MEMORY

(75) Inventors: Mark W. Rouse, Snohomish, WA (US);
Eric D. Blom, Lynnwood, WA (US);
Xuan Nguyen, Puyallup, WA (US);
John Roy, Edmonds, WA (US); Ba Kang Chu, Kirkland, WA (US)

(73) Assignee: Cypress Semiconductor Corporation, San Jose, CA (US)

( * ) Notice: Subject to any disclaimer, the term of this patent is extended or adjusted under 35 U.S.C. 154(b) by 297 days.

(21) Appl. No.: 11/712,069

(22) Filed: Feb. 27, 2007

Related U.S. Application Data

(60) Provisional application No. 60/777,339, filed on Feb. 27, 2006.

(51) Int. Cl.
*G11C 29/00* (2006.01)
*G06F 11/00* (2006.01)

(52) U.S. Cl. ..................... 714/718; 714/819
(58) Field of Classification Search .............. 714/718, 714/719, 799, 736, 724, 746, 758, 819, 807, 714/800, 802, 801, 805, 712, 715; 365/185.33, 365/200, 201
See application file for complete search history.

(56) References Cited

U.S. PATENT DOCUMENTS

| | | | | |
|---|---|---|---|---|
| 5,627,784 | A * | 5/1997 | Roohparvar | 365/189.15 |
| 6,016,560 | A * | 1/2000 | Wada et al. | 714/718 |
| 6,456,875 | B1 * | 9/2002 | Wilkinson et al. | 607/2 |
| 7,102,384 | B1 * | 9/2006 | Speers et al. | 326/39 |
| 7,278,068 | B1 * | 10/2007 | Crowder, Jr. | 714/100 |
| 7,385,418 | B2 * | 6/2008 | Speers et al. | 326/39 |

OTHER PUBLICATIONS

"Reduce Manufacturing Costs with Intel® Flash Memory Enhanced Factory Programming", Intel Application Note 738, Oct. 2000, 12 pages.
Larsen et al., "Improve Programming Performance with Intel Flash Memory Enhanced Factory Programing," Intel Corporation; Jan. 7, 2001; 4 pages.

* cited by examiner

*Primary Examiner*—Phung M Chung

(57) ABSTRACT

A method and apparatus for verifying non-volatile memory. A first transmission of data is received by a first memory of a device. The data is received by a non-volatile memory of the device. The data received by the non-volatile memory is verified by comparing it to the data in the first memory with comparison logic of the device. The verification is performed without receiving a second transmission of the data and without sending a second transmission of the data. A result is generated from the comparison.

22 Claims, 5 Drawing Sheets

SELF VERIFICATION OF NON-VOLATILE MEMORY

RELATED APPLICATIONS

This application claims the benefit of U.S. Provisional Application No. 60/777,339, filed on Feb. 27, 2006.

TECHNICAL FIELD

The present invention relates generally to programmable devices and, more particularly, to self verification of programmable devices.

BACKGROUND

Memory devices include both volatile memory devices (e.g., dynamic random access memory (DRAM), embedded dynamic random access memory (eDRAM), static random access memory (SRAM), etc.) and non-volatile memory devices (e.g., erasable programmable read only memory (EPROM), programmable read only memory (PROM), flash memory, electrically erasable programmable read only memory (EEPROM), nonvolatile random access memory (NVRAM), semiconductor-oxide-nitride-oxide-semiconductor (SONOS) memory, field avalanche metal oxide semiconductor (FAMOS) memory, etc.). With volatile memory devices, data in the memory is erased when power is not supplied to the device. In contrast, with non-volatile memory devices, stored data is retained even when power is not supplied to the device.

Many devices include non-volatile memory that is programmed by a programmer. To ensure that a non-volatile memory has been programmed properly, a verification step is used to confirm that the data was transferred from the programmer to the device's non-volatile memory elements without any errors.

FIG. 1A illustrates a block diagram showing a first conventional apparatus 100 for programming a non-volatile memory and verifying that the non-volatile memory was programmed successfully. The first conventional apparatus 100 includes a programmer 101 coupled with a device 105. The programmer includes a comparison logic 120, and the device includes a non-volatile memory 115. The programmer 101 sends a first data transmission 125 to the device 105 to program the non-volatile memory 115. Once the non-volatile memory 115 has been programmed, the device 105 sends a second data transmission 135 to the programmer 101. The second data transmission 135 includes the data that was programmed to the non-volatile memory 115, which should be the same as the data that was sent in the first data transmission 125. The comparison logic 120 then compares the data originally sent in the first data transmission 125 to the data received in the second data transmission 135. If the two sets of data match, then the non-volatile memory 115 was successfully programmed. If the two sets of data do not match, then the non-volatile memory 115 was not successfully programmed.

FIG. 1B illustrates a block diagram showing a second conventional apparatus 138 for programming a non-volatile memory and verifying that the non-volatile memory was programmed successfully. The second conventional apparatus 138 includes a programmer 145 coupled with a device 150. The device 150 includes a non-volatile memory 155 and a write state machine 160. The programmer 145 sends a first data transmission 165 to the device 150 to program the non-volatile memory 155. Once the non-volatile memory 155 has been programmed, the programmer 145 sends a second data transmission 170 to the device 150 for verification purposes. The second data transmission 170 includes the same data that was originally sent in the first data transmission 165. The write state machine 160 then compares the data originally sent in the first data transmission 165 to the data sent in the second data transmission 170. If the two sets of data match, then the non-volatile memory 155 was successfully programmed. If the two sets of data do not match, then the non-volatile memory 155 was not successfully programmed.

For both conventional apparatuses, each transmission of data is performed over a communications interface, such as cable or wireless link, that connects the programmer to the device. Also, for both conventional apparatuses, each group of data must be sent twice: once in a first data transmission, and once in a second data transmission. To program a non-volatile memory device, many such transmissions may be required, each transmission including a certain amount of data (e.g., 32 bytes, 64 bytes, etc.). The more data that is transmitted, the longer the transmission takes, and the larger the non-volatile memory that is being programmed, the more transmissions that are required.

BRIEF DESCRIPTION OF THE DRAWINGS

The present invention is illustrated by way of example and not limitation in the figures of the accompanying drawings, in which.

DETAILED DESCRIPTION

Described herein is a method and apparatus for verifying a non-volatile memory. A first transmission of data is received by a first memory of a device. The data is received by a non-volatile memory of the device. The data is verified to determine whether it was correctly received by the non-volatile memory. In one embodiment, the data is verified without receiving a second transmission of the data and without sending a second transmission of the data. In one embodiment, that data is verified by comparing the data in the first memory to the data in the non-volatile memory with a comparison logic of the device. A result may be generated based on the comparison.

In the following description, for purposes of explanation, numerous specific details are set forth in order to provide a thorough understanding of the present invention. It will be evident, however, to one skilled in the art that the present invention may be practiced without these specific details. In other instances, well-known circuits, structures, and techniques are not shown in detail or are shown in block diagram form in order to avoid unnecessarily obscuring an understanding of this description.

Reference in the description to "one embodiment" or "an embodiment" means that a particular feature, structure, or characteristic described in connection with the embodiment is included in at least one embodiment of the invention. The appearances of the phrase "in one embodiment" in various places in the specification do not necessarily all refer to the same embodiment.

Embodiments of the present invention include various steps, which will be described below. The steps of the present invention may be performed by hardware components or may be embodied in machine-executable instructions, which may be used to cause a general-purpose or special-purpose processor programmed with the instructions to perform the steps. Alternatively, the steps may be performed by a combination of hardware and software.

Figure 1A:
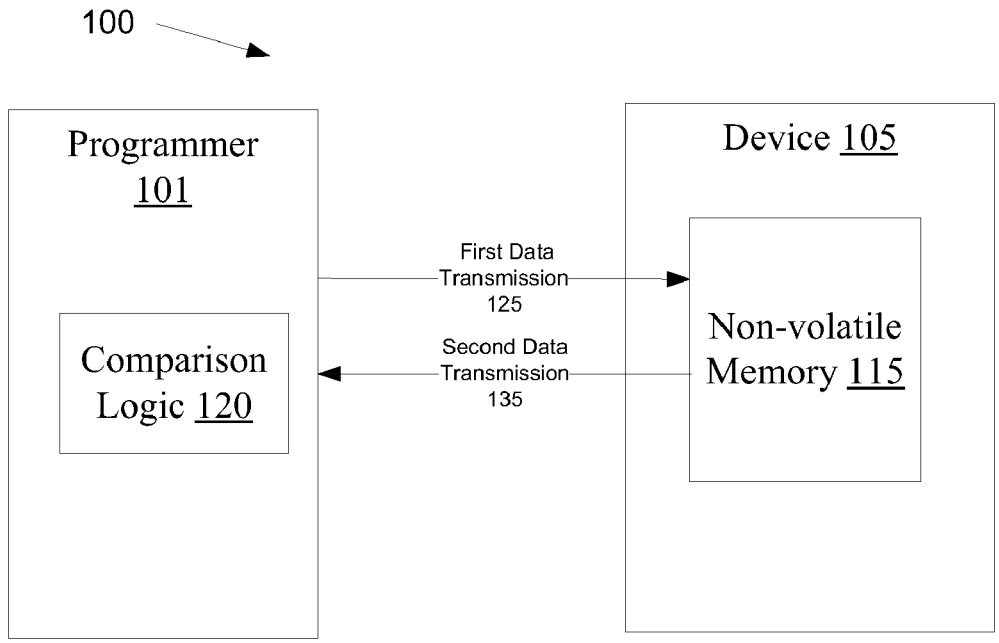
FIG. 1A illustrates a block diagram showing a first conventional apparatus for programming a non-volatile memory and verifying that the non-volatile memory was programmed successfully.
Figure 1B:
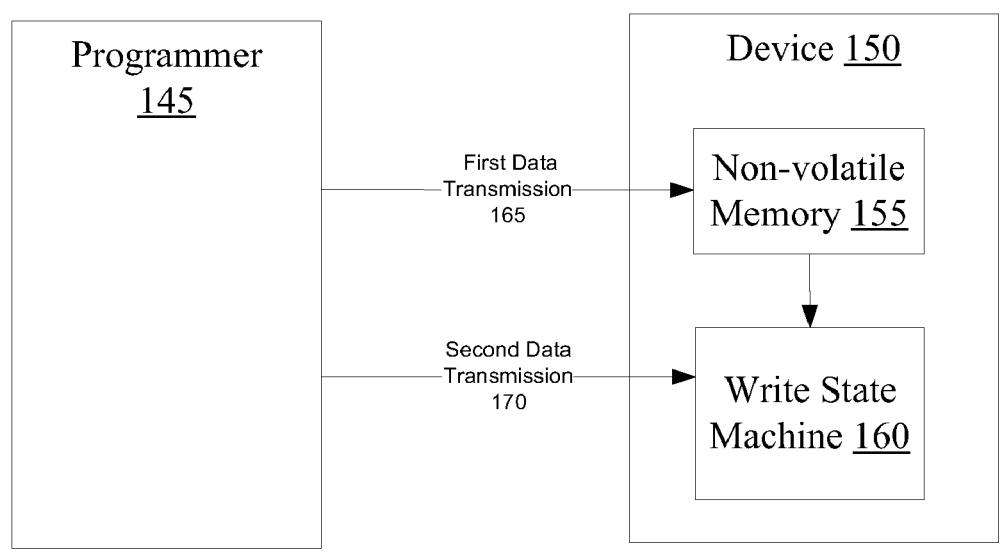
FIG. 1B illustrates a block diagram showing a second conventional apparatus for programming a non-volatile memory and verifying that the non-volatile memory was programmed successfully.
Figure 2A:
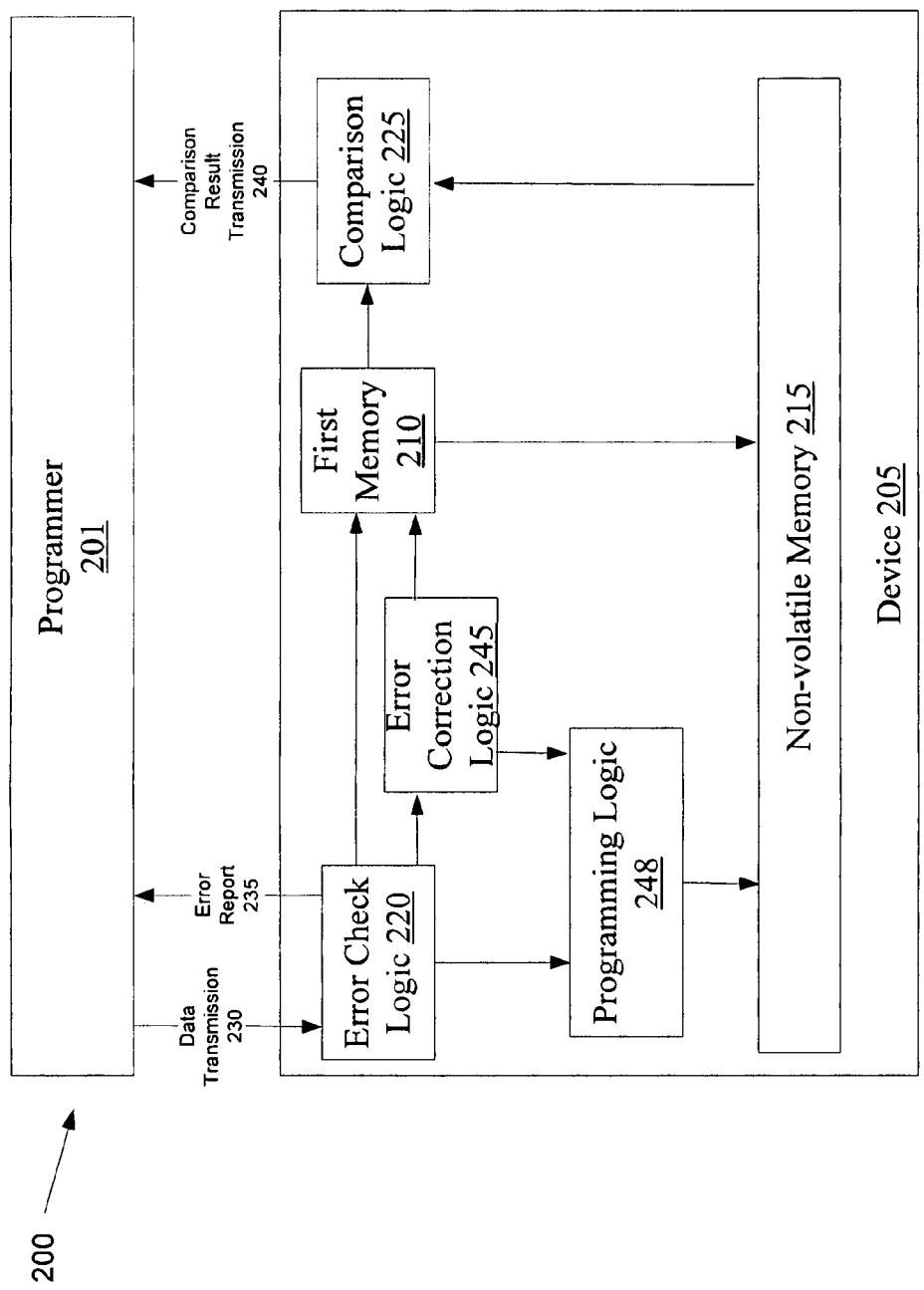
FIG. 2A illustrates a block diagram showing an apparatus for programming a non-volatile memory and verifying that the non-volatile memory was programmed successfully, in accordance with one embodiment of the present invention.

FIG. 2A illustrates a block diagram showing an apparatus 200 for programming a non-volatile memory and verifying that the non-volatile memory was programmed successfully, in accordance with one embodiment of the present invention. The apparatus 200 includes a device 205 coupled to a programmer 201.

The programmer 201 may be used to provide data to the device 205 to program one or more non-volatile memories within the device 205. In one embodiment, the programmer 201 is a general purpose computing device having software that, when executed, enable it to program the device 205. Alternatively, the programmer 201 may be a dedicated hardware configured for programming non-volatile memories within the device 205.

The programmer 201 provides data to the device 205 in a data transmission 230. The data transmission 230 may be an electrical transmission sent across a data cable such as a serial data cable or a parallel data cable, and may include from 1 to n bits of data to be programmed into a non-volatile memory of the device 205. The data transmission 230 may also be an electrical transmission sent through a printed circuit board (PCB), an optical transmission sent over a fiber optic cable, or a wireless transmission using, for example, radiofrequency or infrared. Multiple data transmissions may be sent, each data transmission 230 containing different information targeted at programming a different portion of a non-volatile memory on the device 205. For example, if each data transmission 230 contains 64 bytes of data, and the device 205 has a 256 byte memory to program, then four different data transmissions may be sent.

The device 205 may be part of an apparatus (not shown) to which the device 205 may provide instructions. The device 205 may be included in any apparatus that uses a memory, examples of which include monitors, mp3 players, servers, light switches, telephones, cellular phones, etc.

In one embodiment, the device 205 includes error check logic 220, a non-volatile memory 215, a first memory 210, error correction logic 245, a programming logic 248 and a comparison logic 225. The device 205 may be a circuit board having a plurality of discrete components (e.g., integrated circuits). In one embodiment, each of the error check logic 220, non-volatile memory 215, first memory 210, error correction logic 245, programming logic 248 and comparison logic 225 are separate discrete components (e.g., integrated circuits). In other embodiments, one or more of these components of device 205 may be combined into one or more integrated circuits or multi-chip modules capable of performing the functions of each included circuit and/or logic. Alternatively, the device 205 may be a single integrated circuit that is capable of performing the functions of each included circuit and logic. In one embodiment, the device 205 is a mixed signal controller.

The device 205 may have different configurations than shown in FIG. 2A. Other components than those shown may also be used, and/or one or more of the illustrated components may not be used. For example, the device 205 may not include one or more of the error check logic 220, programming logic 250 and error correction logic 245, and/or the device 205 may include a microcontroller (not shown).

The error check logic 220 may be used to determine whether a data transmission 230 was received without errors. In one embodiment, the error check logic 220 includes a state machine (e.g., an internal logic that knows how to perform a sequence of operations). In other embodiments, the error check logic 220 may include a logic circuit (e.g., a logic that goes through a sequence of events in time, or a logic whose output changes immediately upon a changed input), or a combination of a state machine and a logic circuit. The error check logic 220 may be configured to receive the data transmission 230, and to perform an error check on the data transmission 230. In one embodiment, the error check is a parity check (e.g., an odd/even parity check). Alternatively, the error check may be a bit sum check, a cyclic redundancy check, a block check, etc.

The error check logic 220 may send an error report 235 to the programmer 201 to indicate that the data transmission 230 was received with errors, or to indicate that the data transmission 230 was received without errors. In one embodiment, the error report 235 is a single bit message. Alternatively, the error report 235 may include more information, such as the location of the error within the data set, the expected data, and the actual data. The error report 235 may also include whether the error was due to an erase or a program operation, or whether the error was in a "1" or a "0" logic state.

The programmer 201 may be configured to automatically retransmit the data if the error report 235 indicates that there were errors present in the data transmission 230. Alternatively, the programmer 201 may be configured to prompt a user for user input if the error report 235 indicates that errors were present, or to ignore the error report 235 and continue programming the device 205.

In one embodiment, the device 205 includes error correction logic 245. The error correction logic 245 may be coupled to the error check logic 220 to correct transmission errors when they are detected. In one embodiment, the error correction logic 245 corrects errors by reconstructing the transmitted data, such as by using, for example, golay forward error correction, single-bit code hamming, etc. In one embodiment, the error correction logic 245 is a state machine. Alternatively, the error correction logic 225 may be a logic circuit or a combination of a logic circuit and a state machine.

The first memory 210 may be coupled to both the error check logic 220 and the error correction logic 245. Data may be received from the error check logic 220 if no data correction was necessary, or from the error correction logic 245 if an error correction was performed. The first memory 210 is used for verification of data programmed into the non-volatile memory 215. In one embodiment, the first memory is a volatile memory such as, for example, an SRAM, DRAM, latch, registers, etc. Alternatively, the first memory 210 may be a non-volatile memory such as non-volatile static random access memory (NVSRAM), flash, EPROM, EEPROM, etc.

In one embodiment, the programming logic 248 is coupled to the non-volatile memory 215, to the error check logic 220 and to the error correction logic 245. The programming logic 248 may thereby load data from the error check logic 220 or the error correction logic 245 into the non-volatile memory 215. In one embodiment, the programming logic 248 controls a sequence needed to program the data into the non-volatile memory 215. This sequence may include, for example, supplying a clock signal, sequences, commands, etc., to the non-volatile memory 215. In one embodiment, the programming logic 248 includes a state machine. Alternatively, the programming logic 248 may include a logic circuit, or a combination of a state machine and a logic circuit, or a combination of a microcontroller and a logic circuit.

In one embodiment, in which the device 205 does not include the programming logic 247, the programmer 201 controls the sequence needed to program the data into the non-volatile memory 215. In such an embodiment, the programmer 201 may load the data from the data transmission 230 directly into the non-volatile memory 215.

The non-volatile memory 215 may be any type of non-volatile memory (e.g., flash, PROM, EPROM, EEPROM, SONOS, FAMOS, NVRAM, etc.), and may have a predetermined capacity (e.g., based on application or device requirements). Data forwarded to the non-volatile memory 215 is loaded (e.g., programmed) into the non-volatile memory 215 in a manner such that the data will not be erased in the absence of power. The non-volatile memory 215 may be programmed, for example, with application specific instructions to be performed by the device 205 during operation.

The comparison logic 225 may be coupled to the first memory 210 and the non-volatile memory 215. The comparison logic 225 verifies that the data was correctly programmed into the non-volatile memory 215 by comparing the data in the first memory 210 to the data in appropriate portions of the non-volatile memory 215. In one embodiment, the comparison logic 225 performs a bit by bit comparison of the data in the first memory 210 to the data in the non-volatile memory 215.

In one embodiment, where n number of bits are programmed at a time, the n programmed bits are verified once the nth bit has completed programming. In this embodiment, the first memory 210 may have a capacity equal to or greater than n, where n is the number of bits in the data transmission 230. For example, if 128 bytes are programmed into the non-volatile memory 215 at a time, then the first memory 210 must be able to hold the 128 bytes of data for comparison.

In one embodiment, the comparison logic 225 does not verify the non-volatile memory 215 until the non-volatile memory 215 is completely programmed. In such an embodiment, the first memory 210 should have a storage capacity equal to the storage capacity of the non-volatile memory 215. For example, if each data transmission includes 128 bytes of data, and five such transmissions are necessary to completely program the non-volatile memory 215, then the first memory 210 should have a capacity of 640 bytes or more. In such an embodiment, the comparison logic 225 does not verify the data until each of the data transmissions has been received by the error check logic 220, loaded into the first memory 210, and programmed into the non-volatile memory 215.

In an alternative embodiment, the comparison logic 225 may verify the non-volatile memory 215 once m bits have been programmed into the non-volatile memory 215, where n is a multiple of m. For example, if each data transmission 230 includes 64 bytes of data, and the first memory 210 has a capacity of 128 bytes, then the comparison logic 225 may perform a verification each time the data from two data transmissions are programmed into the non-volatile memory 215.

In one embodiment, the comparison logic 225 generates a result from the comparison, and sends the comparison result 240 to the programmer 201. The programmer 201 thereby knows whether the non-volatile memory 215 of the device 205 was programmed successfully, without data having to be sent twice. No second data transmission needs to be sent from the programmer 201 to the device 205, and no second data transmission needs to be sent from the device 205 to the programmer 201. This may increase both the throughput and efficiency of programming the non-volatile memory 215, and may eliminate a need to have the programmer 201 perform a verification. For example, in one embodiment, the comparison logic 225 may verify the non-volatile memory 215 in approximately 100 ms. In one embodiment, this may reduce the time required to program and verify the device 205 by, for example, about 0.7 seconds.

In one embodiment, the comparison result is a 1 bit message indicating whether the data in the first memory 210 matches the data in the non-volatile memory 215. The comparison result 240 may be a pass result indicating that the non-volatile memory 215 was correctly programmed, or a fail result indicating that the non-volatile memory 215 was not correctly programmed. A fail result is reported when the data in the first memory 210 does not match the data in the non-volatile memory 215. A pass result is reported when the data in the first memory 210 matches the data in the non-volatile memory 215.

Alternatively, the comparison result 240 may contain more information than a single bit that indicates a fail result or a pass result. For example, the comparison result 240 may include a detailed analysis of matching and non-matching bits. In one embodiment, the comparison result 240 includes data indicating which bytes include non-matching bits. In one embodiment, the comparison result 240 includes data indicating exactly which bits were not programmed successfully (e.g., which bits do not match). In one embodiment, the programmer 201 may initially be provided with a one bit comparison result, with the option of receiving a more detailed comparison result upon request. More detailed comparison results may be valuable in determining a cause of a programming failure, or to find patterns in programming failures, such as between devices.

A fail result may also indicate that some or all of the non-volatile memory 215 of the device 205 needs to be reprogrammed. In one embodiment, if a fail result is sent to the programmer 201, the programmer 201 retransmits the data to reprogram portions of the non-volatile memory 215. In one embodiment, only non-matching bits are reprogrammed in the non-volatile memory 215. In other embodiments, bytes having non-matching bits may be reprogrammed, or all data sent in the data transmission 230 may be reprogrammed.

In one embodiment, if a fail result is generated, no data needs to be retransmitted to reprogram the non-volatile memory 215. In such an embodiment, the first memory 210 may be coupled to the non-volatile memory 215 to provide the data to it when a fail result is indicated. Once the non-volatile memory 215 is reprogrammed from data in the first memory 210, the comparison logic 225 may again compare the data in the first memory to the data in the non-volatile memory 215. A comparison result may then be transmitted 240 to the programmer 201.

Figure 2B:
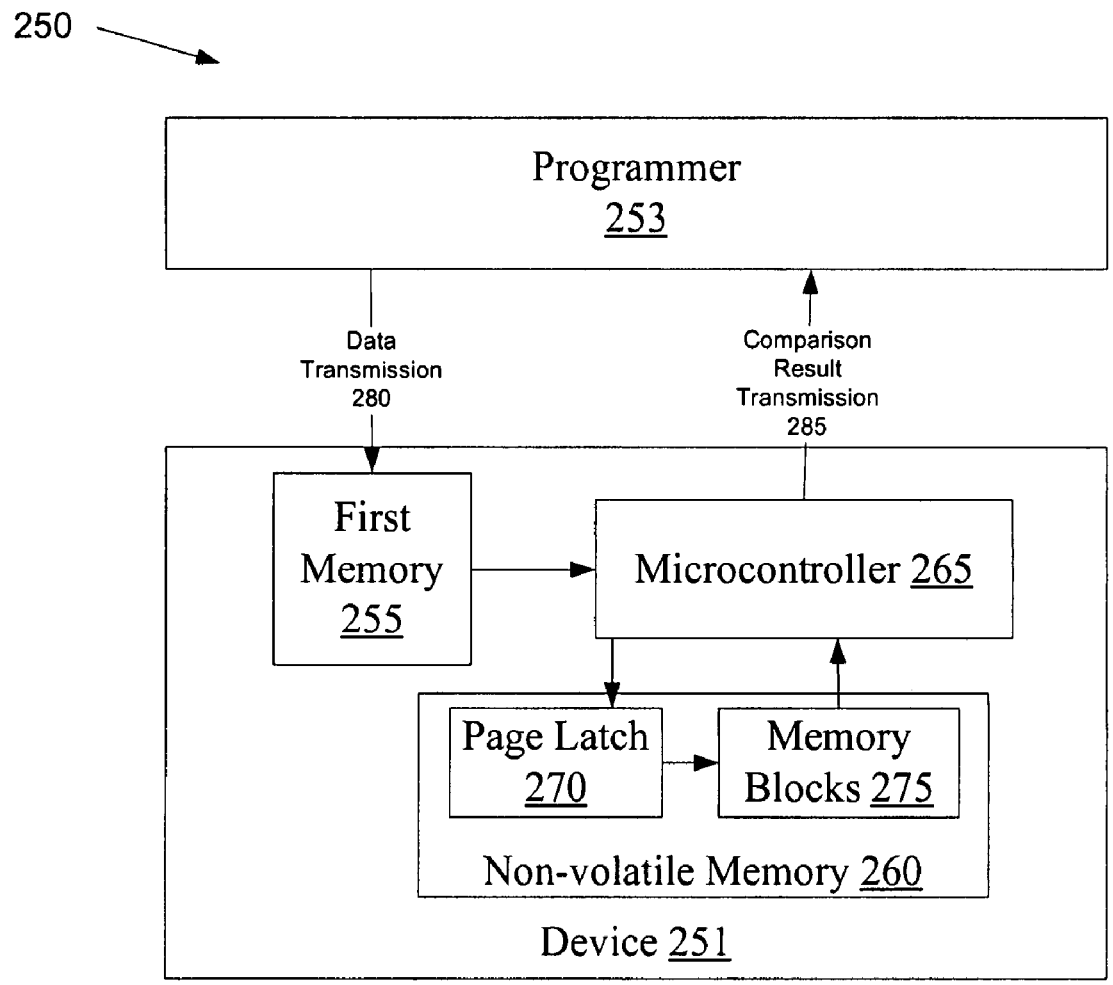
FIG. 2B illustrates a block diagram showing an apparatus for programming a non-volatile memory and verifying that the non-volatile memory was programmed successfully, in accordance with one embodiment of the present invention.

FIG. 2B illustrates a block diagram showing an apparatus 250 for programming a non-volatile memory and verifying that the non-volatile memory was programmed successfully, in accordance with one embodiment of the present invention. The apparatus 250 includes a device 251 coupled to a programmer 253.

The programmer 253 provides data to the device 251 in a data transmission 280. In one embodiment, the device 251 includes a first memory 255, a non-volatile memory 260 and microcontroller 265. The device 251 may be a circuit board having a plurality of discrete components (e.g., integrated circuits). In one embodiment, each of the first memory 255, non-volatile memory 260 and microcontroller 265 are separate discrete components (e.g., integrated circuits). In other embodiments, one or more of the first memory 255, non-volatile memory 260 and microcontroller 265 may be combined into one or more integrated circuits or multi-chip modules capable of performing the functions of each included circuit and/or logic.

Alternatively, the device 251 may be a single integrated circuit that is capable of performing the functions of each included circuit and logic. In one embodiment, device 251 is a mixed signal controller. In one embodiment, the device 251 is a Programmable System on a Chip (PSoC®) processing device, manufactured by Cypress Semiconductor Corporation, San Jose, Calif. Alternatively, device 251 may be one or more processing devices known by those of ordinary skill in the art, such as a microprocessor or central processing unit, a controller, special-purpose processor, digital signal processor (DSP), an application specific integrated circuit (ASIC), a field programmable gate array (FPGA), or the like.

The device 251 may have different configurations than shown. For example, the microcontroller 265 may be replaced or supplemented by one or more state machines and/or logic circuits (e.g., the microcontroller may comprise a first portion of a comparison logic, and a state machine and/or logic circuit may comprise a second portion of the comparison logic, etc.). In one embodiment, the device 251 is not a processing device, and the microcontroller 265 is replaced by logic circuits and/or state machines. For example, the device 205 may be a programmable memory chip.

In one embodiment, the data transmission 280 is received by the first memory 255. The microcontroller 265 may access the first memory 255 and load the data into a page latch 270 of the non-volatile memory 260. The page latch 270 is an area of the non-volatile memory 260 in which the data is stored before it is programmed (written) in a non-volatile way. In one embodiment, the page latch 270 has a capacity equal to the number of bytes sent in the data transmission 280. In one embodiment, the page latch 270 has a capacity equal to the capacity of the first memory 255. The page latch 270 may be both writable and readable. This may eliminate a need for an additional staging area in the non-volatile memory 260 from which to program the non-volatile memory 260 in a non-volatile way. Thus, the overall capacity requirements for the non-volatile memory 260 may be reduced, Read Only Memory (ROM) code may be simplified, and manufacturing cost may be mitigated.

The data is programmed from the page latch 270 into memory blocks 275 of the non-volatile memory 260 in a non-volatile manner (e.g., such that no data will be lost when no power is available to the device 250). The microcontroller 265 may then compare the data in the first memory 255 to the data in the memory blocks 275 of the non-volatile memory 260. A comparison result may be generated by the microcontroller 265 based on this comparison. The comparison result may then be sent 285 to the programmer 253.

In one embodiment, the microcontroller 265 performs some or all of the functions of the programming logic 248 described with reference to FIG. 2A (e.g., controls the sequence needed to program the non-volatile memory, such as supplying clock signals, sequences and commands). In alternative embodiments, such as when no microcontroller 265 is present, the programmer 253 may control the sequence needed to program the non-volatile memory 260.

In one embodiment, the microcontroller 265 performs some or all of the functions of the error check logic 220 of FIG. 2A. The microcontroller 265 may also perform the functions of the error correction logic 245 described with reference to FIG. 2A. Thereby, the microcontroller 265 may error check the received data transmission 280, reconstruct data, send an error report, request a retransmission of data, etc.

In one embodiment, the microcontroller 265 performs some or all of the functions of the comparison logic 225 of FIG. 2A. Thereby, the microcontroller 265 may verify that memory blocks 275 of the non-volatile memory 260 have been programmed successfully, generate a comparison result, and send the comparison result 285 to the programmer 253.

In one embodiment, the microcontroller 265 includes machine readable code that when executed cause the microcontroller 265 to perform the above mentioned functions. In certain embodiments, the microcontroller 265 may be combined with state machines and/or logic circuits such that a portion of one or more of the error check logic, error correction logic, programming logic and comparison logic functions are performed with hardware, and a portion are performed with software.

Figure 3:
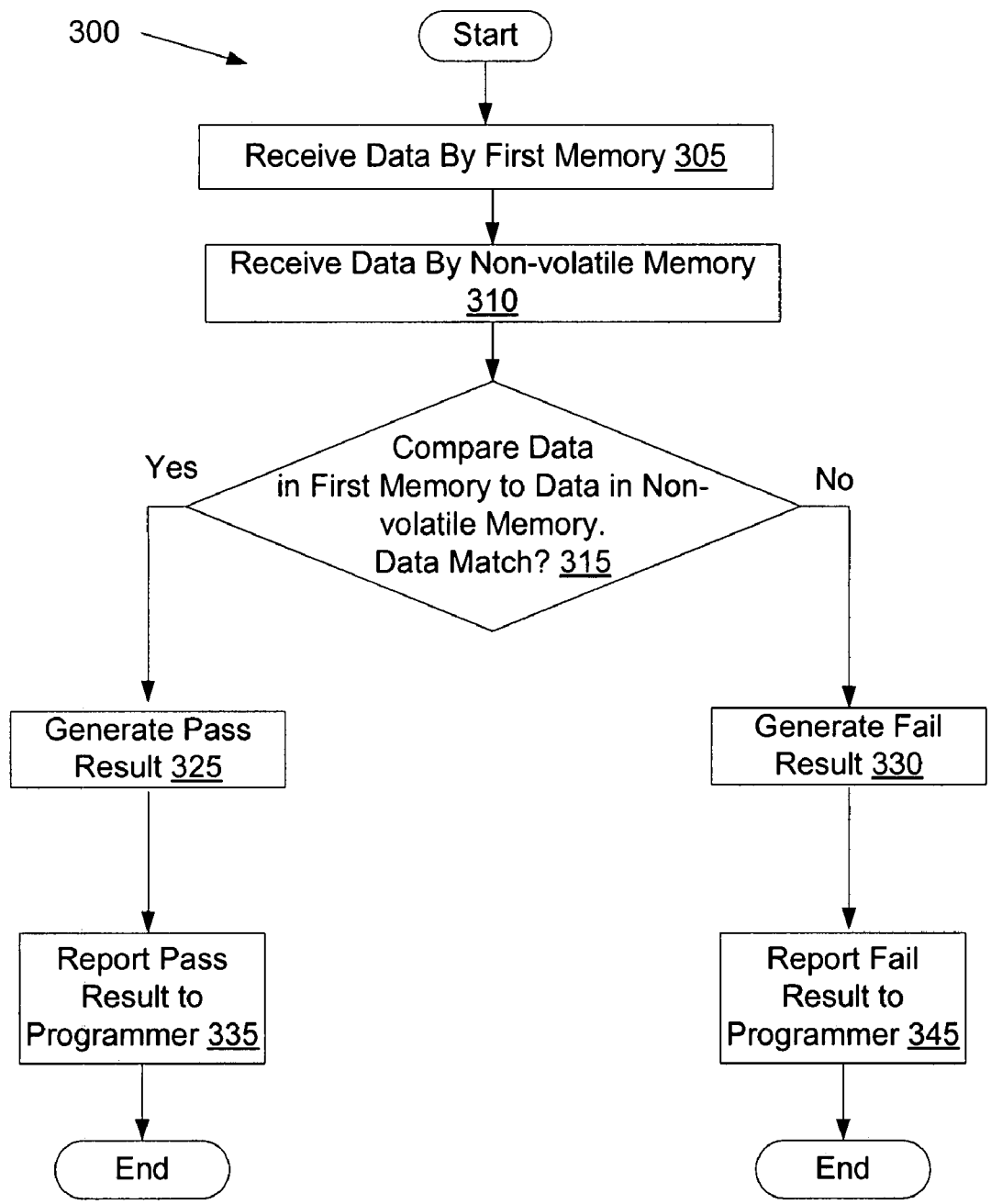
FIG. 3 illustrates a flow diagram of one embodiment for a method of verifying non-volatile memory.

FIG. 3 illustrates a flow diagram of one embodiment for a method 300 of verifying non-volatile memory. The method 300 may be performed by processing logic that may comprise hardware (e.g., circuitry, dedicated logic, programmable logic, microcode, etc.), software (such as instructions run on a processing device), or a combination thereof. In one embodiment, method 300 is performed by the device 205 of FIG. 2A. In one embodiment, the method 300 is performed by the device 251 of FIG. 2B.

Referring to FIG. 3, method 300 begins with processing logic receiving data by a first memory of a device (block 305). Data may be received from a programmer over a communications interface, such as a data cable or a wireless link. The data may be received in a parallel data transmission or a serial data transmission, and may include n bits of data.

At block 310, the data is received by a non-volatile memory of the device. Receiving the data by the non-volatile memory may include programming the data into the non-volatile memory in a non-volatile way. In one embodiment, the non-volatile memory receives the data from the programmer. Alternatively, the non-volatile memory may receive the data from a component of the device, such as the first memory, a microcontroller, a state machine, a logic circuit, etc.

At block 315, processing logic compares the data in the first memory to the data in the non-volatile memory to verify that the data was correctly received by the non-volatile memory. The data may be compared bit by bit to determine whether there are any non-matching bits between the data in the first memory and the data in the non-volatile memory. In one embodiment, the comparison is performed without receiving a second transmission of the data and without sending a second transmission of the data.

If the data in the first memory matches the data in the non-volatile memory, then the method continues to block 325, and a pass result is generated. At block 335, the pass result is then reported to the programmer. The pass result may be a single bit message that indicates that all bits in the non-volatile memory were correctly programmed.

If the data in the first memory does not match the data in the non-volatile memory, then the method continues to block 330, and a fail result is generated. At block 345, the fail result is then reported to the programmer. The fail result may be a single bit message that indicates that not all bits in the nonvolatile memory were correctly programmed. Alternatively, the fail result may contain additional data, such as the addresses of failed bits.

Figure 4:
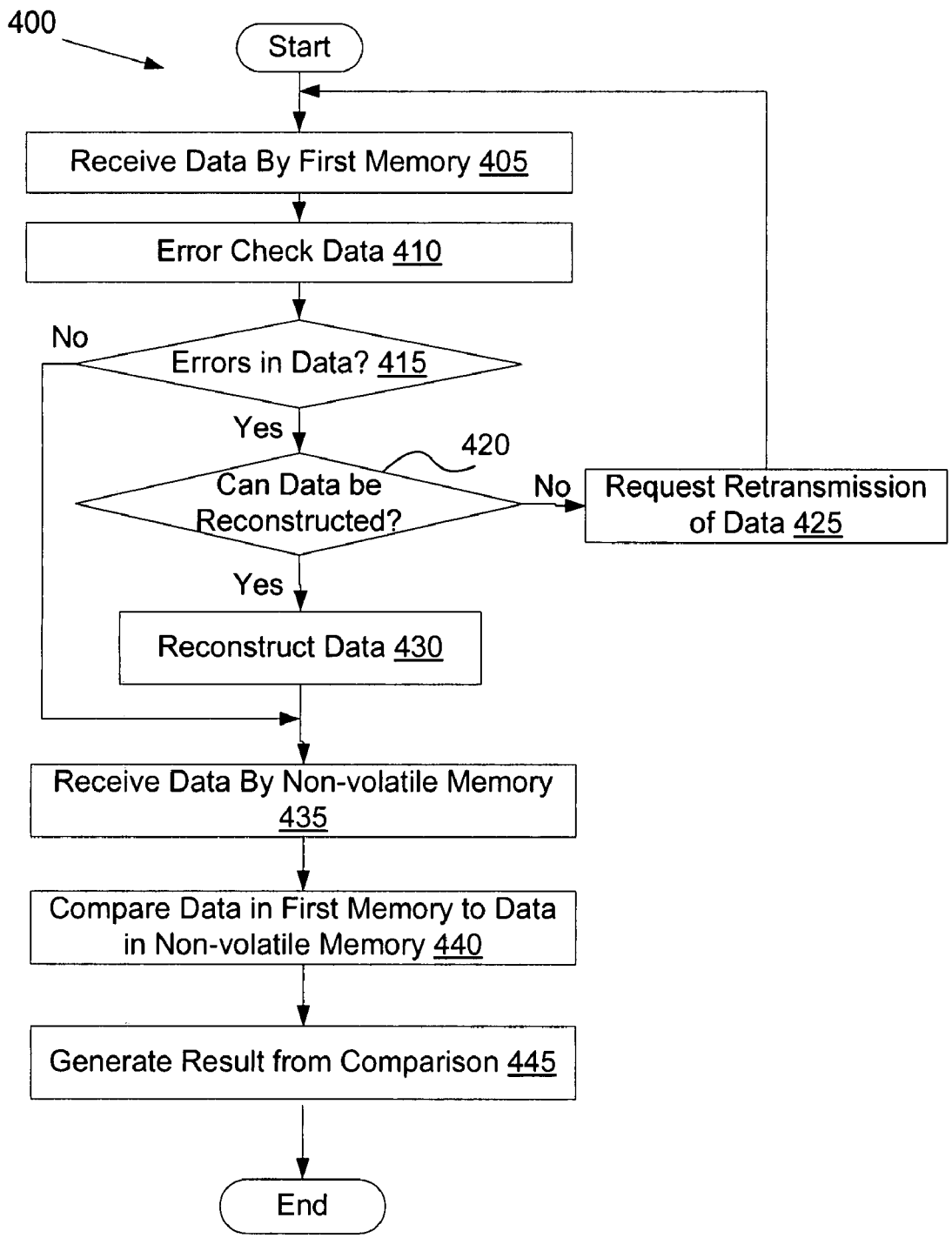
FIG. 4 illustrates a flow diagram of one embodiment for a method of verifying non-volatile memory.

FIG. 4 illustrates a flow diagram of one embodiment for a method 400 of verifying non-volatile memory. The method may be performed by processing logic that may comprise hardware (e.g., circuitry, dedicated logic, programmable logic, microcode, etc.), software (such as instructions run on a processing device), or a combination thereof. In one embodiment, method 400 is performed by the device 205 of FIG. 2A. In one embodiment, the method 400 is performed by the device 251 of FIG. 2B.

Referring to FIG. 4, method 400 begins with processing logic receiving data by a first memory of a device (block 405). At block 410, the data is error checked. In one embodiment, processing logic receives the data by the first memory before the data is error checked. In an alternative embodiment, the data is error checked before it is received by the first memory.

At block 415, processing logic determines whether there are any errors in the data. To make such a determination, processing logic may perform, for example, a parity check, a checksum check, or a cyclic redundancy check. In one embodiment, multiple error checks are made. If errors are detected, then the method continues to block 420. If errors are not detected, then the method continues to block 435.

At block 420, processing logic determines whether the data can be reconstructed. If the data can be reconstructed, the method continues to block 430. If the data cannot be reconstructed, the method continues to block 425. Processing logic may not be able to reconstruct the data, for example, if too many errors are present. In one embodiment, the method continues to block 425 without first determining whether the data can be reconstructed.

At block 425, processing logic requests a retransmission of the data. The method then returns to block 405.

At block 430, processing logic reconstructs the data. The method then continues to block 435.

At block 435, the data is received by a non-volatile memory of the device. In one embodiment, the data is received by a page latch of the non-volatile memory, and then loaded into one or more memory blocks of the non-volatile memory. In one embodiment, the page latch is readable and writable. In one embodiment, the non-volatile memory receives the data from the programmer. Alternatively, the non-volatile memory may receive the data from a component of the device, such as the first memory, a microcontroller, a state machine, a logic circuit, etc.

At block 440, the data in the first memory is compared to the data in the non-volatile memory. The data may be compared bit by bit to determine whether there are any non-matching bits between the data in the first memory and the data in the non-volatile memory. A result is then generated from the comparison (block 445). In one embodiment, the result is then sent to the programmer.

Embodiments of the present invention may be provided as a computer program product, or software, that may include a machine-readable medium having stored thereon instructions, which may be used to program a computer system (or other electronic devices) to perform a process according to embodiments of the present invention. A machine readable medium includes any mechanism for storing or transmitting information in a form (e.g., software, processing application) readable by a machine (e.g., a computer). The machine-readable medium may include, but is not limited to, magnetic storage medium (e.g., floppy diskette); optical storage medium (e.g., CD-ROM); magneto-optical storage medium; read only memory (ROM); random access memory (RAM); erasable programmable memory (e.g., EPROM and EEPROM); flash memory; electrical, optical, acoustical or other form of propagated signal (e.g., carrier waves, infrared signals, digital signals, etc.); or other type of medium suitable for storing electronic instructions.

Although the present invention has been described with reference to specific exemplary embodiments, it will be evident that various modifications and changes may be made to these embodiments without departing from the broader spirit and scope of the invention as set forth in the claims. Accordingly, the specification and drawings are to be regarded in an illustrative rather than a restrictive sense.

What is claimed is:

1. A method of verifying non-volatile memory, comprising:
   receiving a first transmission of data by a device from a system;
   loading the data into a first memory of the device;
   loading the data into a non-volatile memory of the device;
   verifying that the data was correctly loaded into the non-volatile memory, without receiving a second transmission of the data from the system and without sending a second transmission of the data to the system, by comparing the data in the first memory to the data in the non-volatile memory with a comparison logic of the device; and
   generating a result of the comparison.

2. The method of claim 1, wherein comparing the data includes performing a bit-by-bit comparison of the data in the first memory to the data in the non-volatile memory.

3. The method of claim 1, further comprising:
   reporting the result to the system, wherein the result is a pass result if the data in the non-volatile memory matches the data in the first memory, and wherein the result is a fail result if the data in the non-volatile memory does not match the data in the first memory.

4. The method of claim 1, further comprising:
   error checking the received data.

5. The method of claim 4, wherein error checking the data includes at least one of performing a parity check, a checksum check, and a cyclic redundancy check.

6. The method of claim 4, further comprising:
   reconstructing the received data that has failed the error check.

7. The method of claim 1, wherein receiving the data by the non-volatile memory includes receiving the data in a page latch of the non-volatile memory and loading the data from the page latch to one or more memory blocks of the non-volatile memory, wherein the page latch is readable and writable.

8. An apparatus, comprising:
   an input to receive data in a first transmission from a system during programming;
   a first memory to receive the data from the input during programming;
   a non-volatile memory to receive the data from the input during programming; and
   a comparison logic coupled to the first memory and the non-volatile memory, the comparison logic to compare data in the first memory to data in the non-volatile memory without retransmission of the data to the first memory and the non-volatile memory, and to generate a result based on the comparison.

9. The apparatus of claim 8, further comprising:
   a microcontroller, wherein the microcontroller is a component of the comparison logic.

10. The apparatus of claim 9, further comprising:
at least one of a state machine and a logic circuit that is a component of the comparison logic.

11. The apparatus of claim 8, further comprising:
at least one of a state machine or a logic circuit that is a component of the comparison logic.

12. The apparatus of claim 8, wherein the comparison logic to send the result to the system, the result being a pass result if the data in the non-volatile memory matches the data in the memory, and the result being a fail result if the data in the non-volatile memory does not match the data in the first memory.

13. The apparatus of claim 8, further comprising:
an error check logic to error check the received data from the system.

14. The apparatus of claim 13, further comprising a microcontroller:
wherein the microcontroller is a component of the error check logic.

15. The apparatus of claim 13, further comprising:
at least one of a state machine and a logic circuit that is a component of the error check logic.

16. The apparatus of claim 8, wherein the non-volatile memory includes a page latch that is readable and writable, the page latch to receive the data and to load the data to a portion of the non-volatile memory.

17. The apparatus of claim 16, wherein the page latch has a capacity that is approximately equal to a number of bytes that are received in the first transmission.

18. The apparatus of claim 8, wherein the first memory, non-volatile memory and comparison logic comprise an active electronic component, and wherein the apparatus further comprises the system configured to be coupled to the active electronic component to send the first transmission of the data to the active electronic component and to receive the comparison result from the active electronic component.

19. The apparatus of claim 18, wherein the system is to determine whether the non-volatile memory has been correctly programmed based on the comparison result, without a second transmission of the data to the device and without a transmission of the data from the device to the system.

20. An apparatus, comprising:
means for receiving a first transmission of data by a device from a system;
means for loading the data into a first memory of the device
means for loading the data into a non-volatile memory of the device;
means for verifying that the data was correctly loaded into the non-volatile memory without receiving a second transmission of the data from the system and without sending a second transmission of the data to the system by comparing the data in the first memory to the data in the non-volatile memory with a comparison logic of the device; and
means for generating a result of the comparison.

21. The apparatus of claim 20, further comprising:
means for reporting the result to the system, wherein the result is a pass result if the data in the non-volatile memory matches the data in the first memory, and wherein the result is a fail result if the data in the non-volatile memory does not match the data in the first memory.

22. The apparatus of claim 20, further comprising:
means for error checking the received data.

* * * * *